(12) United States Patent
von Koblinski et al.

(10) Patent No.: US 9,608,201 B2
(45) Date of Patent: Mar. 28, 2017

(54) SEMICONDUCTOR DEVICES HAVING INSULATING SUBSTRATES AND METHODS OF FORMATION THEREOF

(71) Applicant: Infineon Technologies AG, Neubiberg (DE)

(72) Inventors: Carsten von Koblinski, Bodensdorf (AT); Volker Strutz, Tegernheim (DE); Manfred Engelhardt, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/181,733

(22) Filed: Jun. 14, 2016

(65) Prior Publication Data

US 2016/0284990 A1  Sep. 29, 2016

Related U.S. Application Data

(62) Division of application No. 14/188,112, filed on Feb. 24, 2014, now Pat. No. 9,391,263, which is a division
(Continued)

(51) Int. Cl.
*H01L 23/31* (2006.01)
*H01L 43/14* (2006.01)
(Continued)

(52) U.S. Cl.
CPC .............. *H01L 43/14* (2013.01); *H01L 21/78* (2013.01); *H01L 21/84* (2013.01);
(Continued)

(58) Field of Classification Search
CPC .............. H01L 23/3171; H01L 23/3178; H01L 23/3185
See application file for complete search history.

(56) References Cited

U.S. PATENT DOCUMENTS

| 4,086,375 A | 4/1978 | LaChapelle, Jr. et al. |
| 7,605,580 B2 | 10/2009 | Strzalkowski |

(Continued)

FOREIGN PATENT DOCUMENTS

| CN | 101174572 A | 5/2008 |
| CN | 101202254 A | 6/2008 |

(Continued)

*Primary Examiner* — Phat X Cao
(74) *Attorney, Agent, or Firm* — Slater Matsil, LLP

(57) ABSTRACT

In one embodiment, a method of forming a current sensor device includes forming a device region comprising a magnetic sensor within and/or over a semiconductor substrate. The device region is formed adjacent a front side of the semiconductor substrate. The back side of the semiconductor substrate is attached over an insulating substrate, where the back side is opposite the front side. Sidewalls of the semiconductor substrate are exposed by dicing the semiconductor substrate from the front side without completely dicing the insulating substrate. An isolation liner is formed over all of the exposed sidewalls of the semiconductor substrate. The isolation liner and the insulating substrate include a different material. The method further includes separating the insulating substrate to form diced chips, removing at least a portion of the isolation liner from over a top surface of the device region, and forming contacts over the top surface of the device region.

18 Claims, 16 Drawing Sheets

Related U.S. Application Data of application No. 13/007,892, filed on Jan. 17, 2011, now Pat. No. 8,722,514.

(51) Int. Cl.

| | |
|---|---|
| *H01L 21/78* | (2006.01) |
| *H01L 21/84* | (2006.01) |
| *H01L 27/12* | (2006.01) |
| *H01L 27/22* | (2006.01) |
| *H01L 43/06* | (2006.01) |
| *H01L 43/12* | (2006.01) |
| *H01L 23/00* | (2006.01) |
| *H01L 43/04* | (2006.01) |

(52) U.S. Cl.
CPC ...... *H01L 23/3171* (2013.01); *H01L 23/3178* (2013.01); *H01L 23/3185* (2013.01); *H01L 24/06* (2013.01); *H01L 27/12* (2013.01); *H01L 27/22* (2013.01); *H01L 43/04* (2013.01); *H01L 43/065* (2013.01); *H01L 43/12* (2013.01); *H01L 23/3121* (2013.01); *H01L 2224/04042* (2013.01); *H01L 2224/05553* (2013.01); *H01L 2224/48091* (2013.01); *H01L 2224/48463* (2013.01); *H01L 2224/73265* (2013.01); *H01L 2924/01322* (2013.01); *H01L 2924/10253* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/14* (2013.01); *H01L 2924/1461* (2013.01); *H01L 2924/15788* (2013.01); *H01L 2924/181* (2013.01); *H01L 2924/3011* (2013.01)

(56) References Cited

U.S. PATENT DOCUMENTS

| | | |
|---|---|---|
| 7,790,506 B2 | 9/2010 | Fukuda |
| 8,178,415 B2 | 5/2012 | Furumura et al. |
| 2001/0042902 A1 | 11/2001 | Wakabayashi et al. |
| 2004/0251520 A1 | 12/2004 | Sasaki et al. |
| 2006/0284611 A1 | 12/2006 | Ishio |
| 2007/0026639 A1 | 2/2007 | Noma et al. |
| 2008/0093708 A1 | 4/2008 | Noma et al. |
| 2008/0197455 A1 | 8/2008 | Fukuda |
| 2010/0156394 A1 | 6/2010 | Ausserlechner et al. |
| 2010/0174103 A1 | 7/2010 | Nakagawa et al. |
| 2010/0283127 A1 | 11/2010 | Leib |
| 2010/0288525 A1 | 11/2010 | Basavanhally et al. |
| 2011/0048633 A1 | 3/2011 | Aratake |

FOREIGN PATENT DOCUMENTS

| | | |
|---|---|---|
| CN | 101259951 A | 9/2008 |
| DE | 19741924 A1 | 4/1999 |
| JP | 2009200526 A1 | 9/2009 |

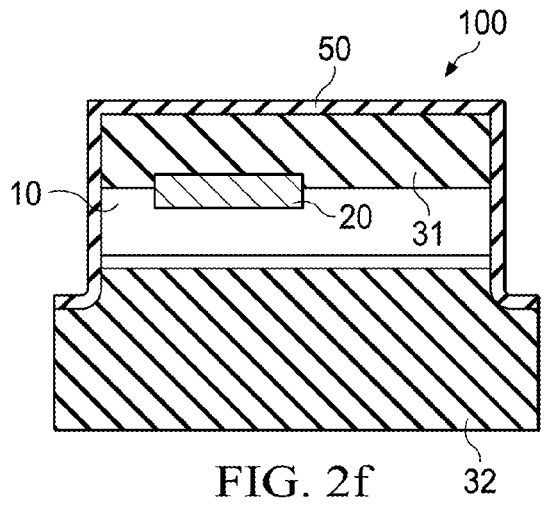
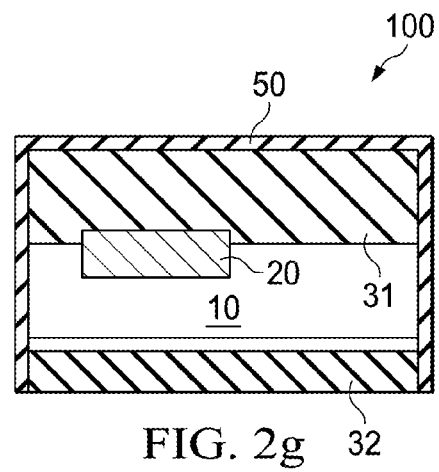
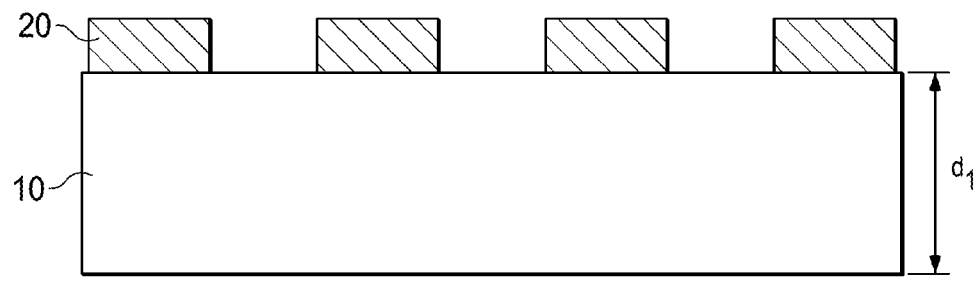
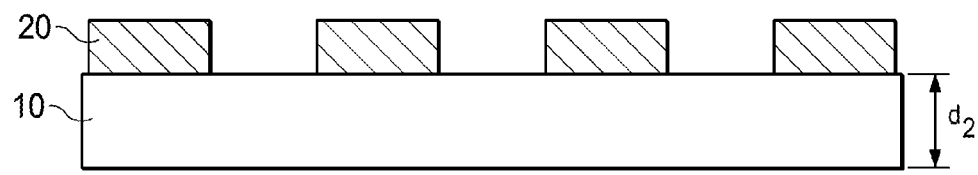

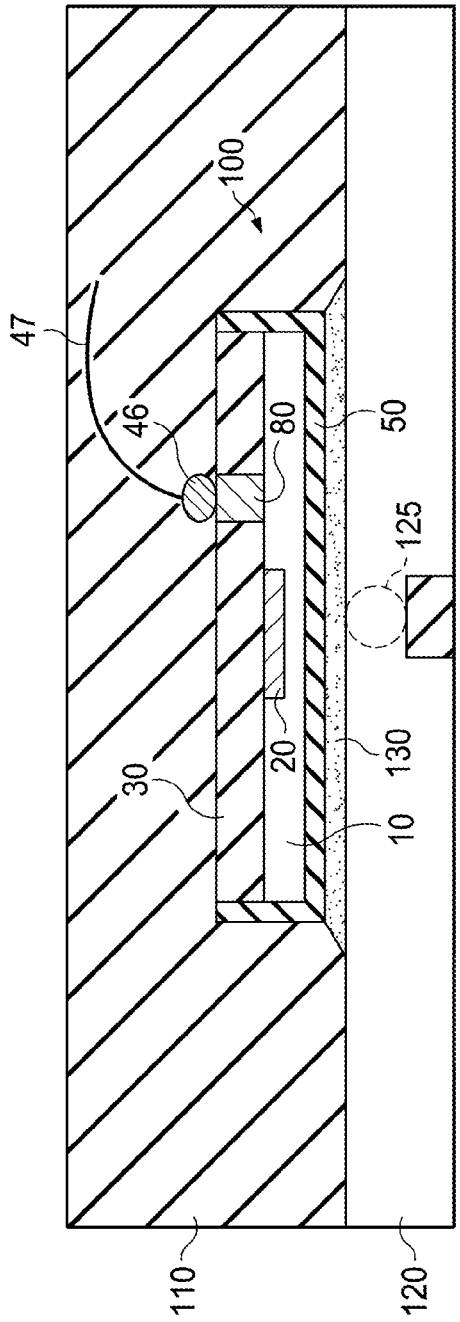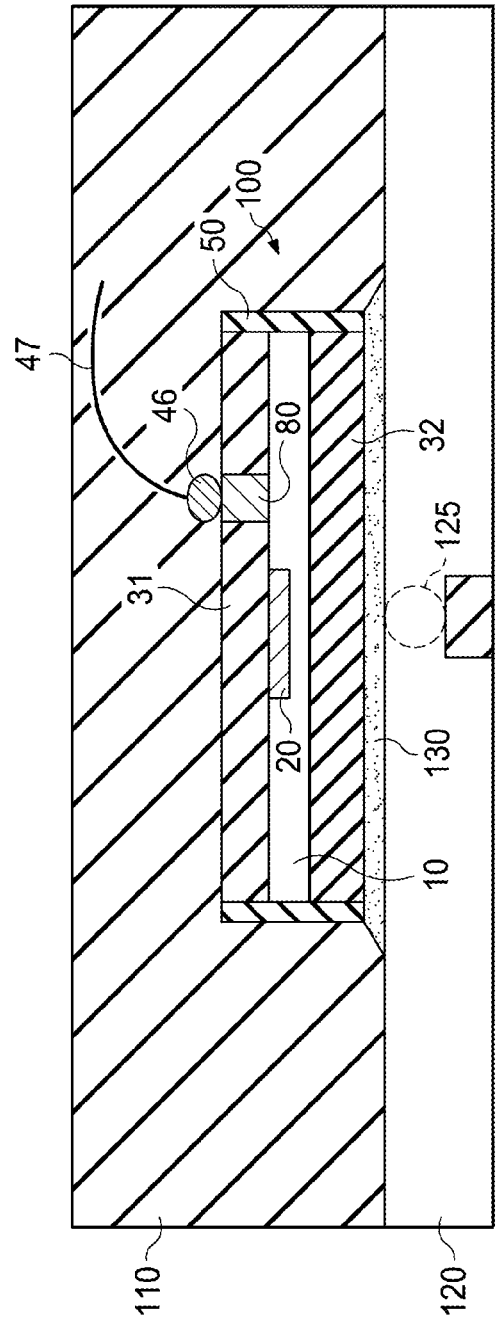

SEMICONDUCTOR DEVICES HAVING INSULATING SUBSTRATES AND METHODS OF FORMATION THEREOF

CROSS-REFERENCE TO RELATED APPLICATIONS

This application is a divisional of U.S. application Ser. No. 14/188,112 filed on Feb. 24, 2014, which is a divisional of U.S. application Ser. No. 13/007,892 filed on Jan. 17, 2011, which applications are hereby incorporated herein by reference.

TECHNICAL FIELD

The present invention relates generally to semiconductor devices, and more particularly to semiconductor devices having insulating substrates and methods of formation thereof.

BACKGROUND

In many applications of electronic components, large electric currents or large electric voltages are applied to the outer surfaces of the electronic components. Examples of such applications include current sensors, where conductors carrying large electric currents are placed on (typically contacting) a major surface of the electronic component. Such applications require good isolation of the working semiconductor regions from the extreme electrostatic potential and currents.

Hence, what are required are improved devices and methods of forming devices that offer improved isolation to high voltage or current applications.

SUMMARY

These and other problems are generally solved or circumvented, and technical advantages are generally achieved, by illustrative embodiments of the present invention.

In accordance with an embodiment of the present invention, a semiconductor device comprises an insulating substrate, and a semiconductor substrate disposed on the insulating substrate. The semiconductor material of the semiconductor substrate has about the same thermal expansion coefficient as the insulating substrate. A device region is disposed within the semiconductor substrate. An isolation layer lines the sidewalls of the semiconductor substrate.

In accordance with an alternative embodiment of the present invention, a semiconductor device comprises a glass substrate, and a semiconductor substrate disposed on the insulating substrate. A magnetic sensor is disposed within and/or over the semiconductor substrate.

In accordance with an alternative embodiment of the present invention, a method of forming a semiconductor device comprises forming a device region within and/or over a semiconductor substrate. The device region is formed adjacent a front side of the semiconductor substrate. The back side of the semiconductor substrate, which is the opposite the front side, is attached over an insulating substrate. The semiconductor substrate is diced to expose sidewalls of the semiconductor substrate without completely dicing through the insulating substrate to keep the wafer-shape for further processing. An isolation liner is formed over the exposed sidewalls of the semiconductor substrate. The insulating substrate is separated to form diced chips.

In accordance with an alternative embodiment of the present invention, a method of forming a semiconductor device comprises forming a device region within and/or over a semiconductor substrate. The device region is formed adjacent a front side of the semiconductor substrate. An insulating substrate is attached over the front side of the semiconductor substrate. The semiconductor substrate is thinned from a back side, which is opposite the front side. The semiconductor substrate is diced from the back side without completely dicing the insulating substrate to expose sidewalls of the thinned semiconductor substrate. Individual chips are formed by singulation.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2a-2g, illustrates alternative structural embodiments of a semiconductor device;

FIG. 3, which includes FIGS. 3a-3h, illustrates cross sectional views of a semiconductor device in various stages of processing in accordance with various embodiments of the invention;

FIG. 4, which includes

FIG. 5, which includes

FIG. 6, which includes

FIG. 7, which includes

FIG. 8, which includes FIGS. 8a-8d, illustrates a chip package in accordance with various embodiments of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Various embodiments of the present invention describe devices, and methods of isolating chips on all sides to secure susceptible chip components from high voltage and/or currents. Many semiconductor components used in high voltage and/or high current environments require excellent integrity of the isolation regions that surround the chips. Poor isolation quality can result in irreversible harm to sensitive devices. One type of devices very susceptible to high current damage include current sensors, which typically use magnetic sensors. Such devices must be placed adjacent high current conductors without creating any current paths into the current sensor itself.

Embodiments of the invention overcome these problems using the described device structures and methods of forming the same. Various embodiments of the invention teach adding a insulating substrate under the semiconductor substrate used in the formation of the chips. For example, a glass substrate may be used as the insulating substrate. The insulating substrate not only acts as an insulator, it may also be used to support the semiconductor substrate during fabrication (as a carrier) thereby allowing thinning down the thickness of the semiconductor substrate and allowing the formation of an isolation liner around the sidewalls of the semiconductor substrate and allows to process "singulated chips" on an intact wafer. After all processing, the insulating substrate is singulated forming individual chips each having a portion of the attached insulating substrate.

Thus, unlike typical chips having mold compound underneath the semiconductor substrate, embodiments of the invention include an insulating substrate, which provides better electrical isolation characteristics than mold compound. Further, the physical and electrical properties of the insulating substrate can be closely tailored for a given application. For example, the density and thickness of the insulating substrate can be closely controlled while forming the insulating substrate unlike mold compounds, which are deposited or coated onto the semiconductor substrate.

Only as an illustration, the specific embodiments of the invention are described with respect to magnetic sensors such as Hall effect sensors, however various embodiments of the invention include any type of integrated circuit or discrete device formed within and/or over a semiconductor substrate that requires isolation from high current/voltage sources.

Figure 1:
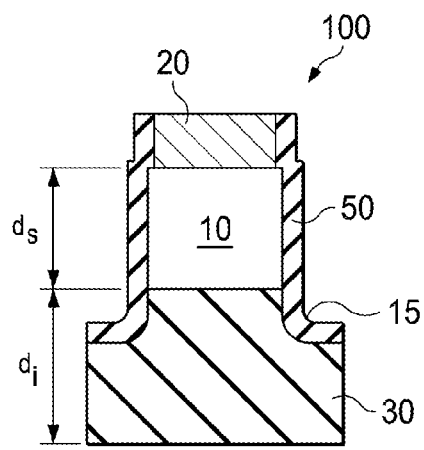
FIG. 1 illustrates a structural embodiment of a semiconductor device.

FIG. 1 illustrates a structural embodiment of a semiconductor device. Further structural embodiments of the semiconductor device are described in FIGS. 2 and 8-9. FIGS. 3-7 describe various embodiments of fabricating the semiconductor device.

Referring to FIG. 1, a chip 100 includes a semiconductor substrate 10 disposed over an insulating substrate 30. The semiconductor substrate 10 may comprise structures 20, which may be disposed over and/or within the semiconductor substrate 10. In one or more embodiments, the structures 20 may include doped regions disposed within the semiconductor substrate 10 as well as metallization and contact structures disposed over the semiconductor substrate 10.

The insulating substrate 30 comprises a substrate having an insulating material. An example of insulating substrate 30 is a glass substrate. The glass substrate comprises silicon dioxide, and about 70% to about 80% silicon dioxide in one embodiment. The glass substrate comprises silicon dioxide, and about 50% to about 80% silicon dioxide in one embodiment. The glass substrate comprises at least 50% silicon dioxide. The glass substrate comprises is less than 90% silicon dioxide. The insulating substrate 30 may comprise sodium, calcium, synthetic aluminum oxide (corundum) and/or other additives. In one embodiment, the insulating substrate 30 comprises a same coefficient of expansion as the semiconductor substrate 10. In various embodiments, the composition of the insulating substrate 30 is varied after selecting the semiconductor substrate 10.

In various embodiments, the insulating substrate 30 comprises a thickness $d_t$ of about 200 μm to about 600 μm. The semiconductor substrate 10 comprises a thickness $d_s$ of about 100 μm to about 400 μm.

The insulating substrate 30 provides excellent isolation along the bottom surface of the chip. The isolation provided by the insulating substrate 30 is better than that achievable with the use of mold compounds.

The chip 100 also includes a collar in which an isolation layer 50 (isolation liner) covers the sidewalls of the chip 100, especially the sidewalls of the semiconductor substrate 10. Thereby, the chip 100 is completely isolated along the sides. Typically chip edges such as sidewalls and corners are susceptible to shorting because of weak points or damage remaining from chip singulation processes. Embodiments of the invention overcome this problem with the use of the isolation layer 50.

In one embodiment, the semiconductor substrate 10 comprises a magnetic sensor such as a Hall effect sensor. A Hall effect sensor is a device that varies its output voltage in response to changes in magnetic field. Hall effect sensors are used in applications such as positioning and position detection, proximity switching, speed detection, current sensing, e-mobility etc. Hall effect devices are often implemented in integrated circuit semiconductor devices.

In various embodiments, the Hall effect sensor may comprise a plurality of doped regions thereby forming a plurality of Hall effect sensor elements. A Hall effect sensor element may be a doped region through which a current flows in a first direction, an electrical voltage being measured in a second direction.

The Hall effect sensor may be used to calculate the current flow in a conductor without directly measuring the current by measuring the magnetic field. When the chip 100 is placed within a magnetic field created by a current in a conductor (e.g. placed below the insulating substrate 30), the magnetic flux lines deflect the charge carriers, electrons and holes, in a Hall effect sensor element. As these electrons and holes move sidewards, a potential difference, called the Hall voltage, is produced between the two sides of the Hall effect sensor element by the build-up of these charge carriers. The Hall voltage is directly proportional to the strength of the magnetic field passing through the semiconductor material. Therefore, the Hall effect sensor element can measure the current flowing through the conductor.

In other embodiments, the Hall-effect sensor element may comprise a metallic resistor. The change in the resistance of the metallic resistor is termed the magneto-resistive effect and is directly related to the angle of the current flow and the magnetization vector of the film which is influenced by the magnetic field to be measured.

The chip 100 may include DC amplifiers, logic switching circuits and voltage regulators to improve the sensors sensitivity, hysteresis and output voltage thereby enabling the chip 100 to sense over a wider range of operating conditions. The Hall effect sensor within the chip 100 may also include additional circuitry/devices such as resistors, and transistors known to one skilled in the art.

In other embodiments, the chip 100 may comprise other types of sensor chips. In various embodiments, the insulating substrate 30 protects the active portions of the chip 100. In one embodiment, the insulating substrate 30 protects the chip 100 from high currents. The chips may comprise a current sensor in one embodiment. The chip 100 may also function fully electrically, for example as Hall effect sensors. In other embodiments, the chip 100 may comprise other types of sensors or protection devices that require protection from external environments.

In some embodiments, the chip 100 may comprise electromechanical functional elements. An example of an electromechanical sensor is a microphone or a gas sensor. The sensor chips may be micro electro mechanical system (MEMS), wherein micromechanical movable structures such as, for example, bridges, membranes or reed structures may be provided. Such sensor chips may be motion sensors which may be embodied as acceleration sensors (detecting accelerations in different spatial directions) or rotation sensors. Sensors of this type are also referred to as gyrosensors, roll-over sensors, impact sensors, inertial sensors, etc. They may be used for example in the automotive industry for signal detection in ESP (Electronic Stability Program) systems, ABS (Anti-lock Braking Systems), airbags and the like.

The chip 100 may also include other digital, analog, logic, memory components. The chip 100 may include, for example, power semiconductor devices, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Further, the chips 100 may include control circuits, microprocessors, and other suitable components known to one skilled in the art. For example, a chip 100 may be an application specified integrated circuit (ASIC) that processes signals received from a sensor device within the chip 100 and may also be configured to control the sensor device.

Although not illustrated, in various embodiments, the insulating substrate 30 may be attached to a chip carrier such as Bump Chip Carrier, Ball Grid Array, or other suitable chip carriers. In various embodiments, the chip 100 may be further packaged, e.g., using a mold compound. A semiconductor package thereby formed may include a supporting leadframe having leads, a semiconductor chip electrically coupled to the leadframe, and an encapsulating material molded over a surface of the leadframe and the chip 100.

FIG. 2, which includes FIGS. 2a-2g, illustrates alternative structural embodiments of the chip.

Figure 2A:
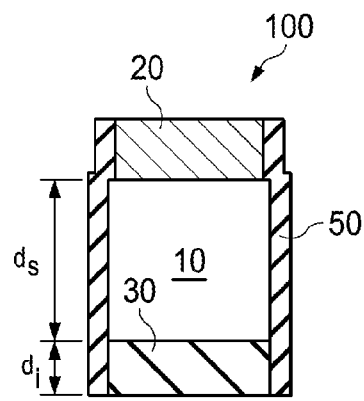

As illustrated in FIG. 2a, in one embodiment, the thickness $d_i$ of the insulating substrate 30 may be much thinner than the thickness $d_s$ of the semiconductor substrate 10. For example, in one embodiment, the ratio $d_i:d_s$ is greater than about 1:3, and greater than 1:10 in one embodiment. The illustrated embodiment also does not include a collar region 15 as in FIG. 1.

Figure 2B:
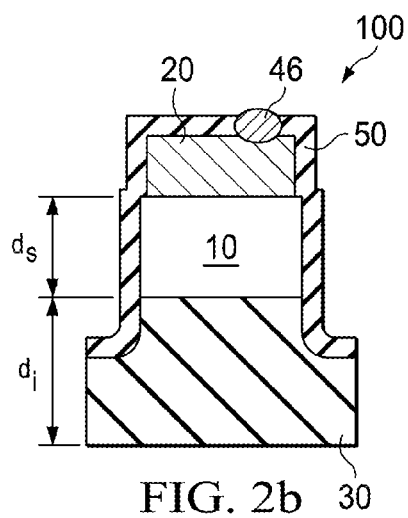

FIG. 2b illustrates an alternative embodiment having an isolated or local contact 46 formed within the isolation layer 50 covering the sidewalls of the semiconductor substrate 10 of the chip 100.

Figure 2C:
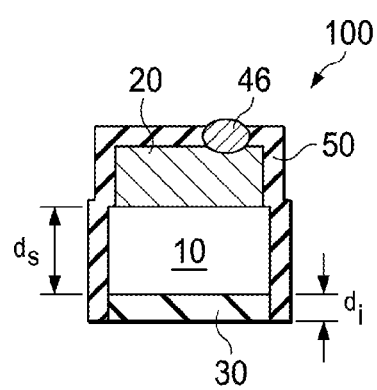

FIG. 2c illustrates another embodiment including the local contact 46. However, in this embodiments, as in the embodiment illustrated in FIG. 2a, the thickness $d_i$ of the insulating substrate 30 may be much thinner than the thickness $d_s$ of the semiconductor substrate 10.

Figure 2D:
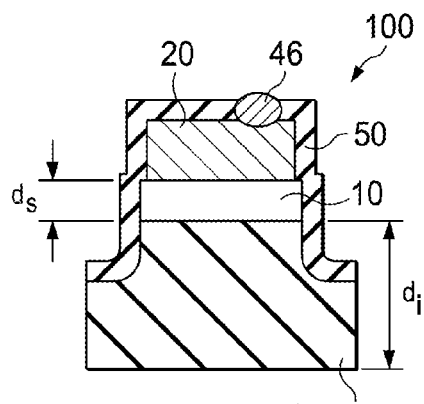

FIG. 2d illustrates a structural embodiment, wherein the thickness $d_i$ of the insulating substrate 30 may be much larger than the thickness $d_s$ of the semiconductor substrate 10. In various embodiments, as illustrated in FIG. 2d, the semiconductor substrate 10 has been thinned down to about 50 μm or less, and about 10 μm to about 50 μm in one embodiment.

Figure 2E:
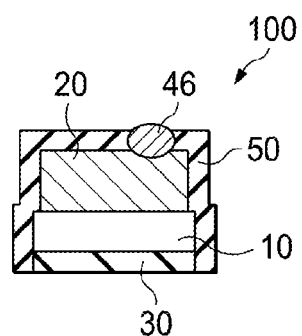

FIG. 2e illustrates an embodiment of the invention having thinned down semiconductor substrate 10 and thinned down insulating substrate 30. The thickness $d_i$ of the insulating substrate 30 and the thickness $d_s$ of the semiconductor substrate 10 may be about 50 μm or less, and about 10 μm to about 50 μm in one embodiment.

FIGS. 2f and 2g illustrates an embodiment of the invention having multiple insulating substrates, a first insulating substrate 31 over the semiconductor substrate 10 and a second insulating substrate 32 under the semiconductor substrate 10.

In FIG. 2f, the second insulating substrate 32 is thicker than the first insulating substrate 31, which has been thinned down. In contrast, in FIG. 2g, the first insulating substrate 31 is thicker than the second insulating substrate 32, which has been thinned down.

FIG. 3, which includes FIGS. 3a-3h, illustrates cross sectional views of a semiconductor device in various stages of processing in accordance with various embodiments of the invention.

Referring to FIG. 3a, the semiconductor device includes structures 20 disposed over the semiconductor substrate 10. The semiconductor substrate 10 comprises a silicon substrate in one embodiment. In various embodiments, the semiconductor substrate 10 comprises an alloy such as SiGe or SiC or a compound semiconductor such as a III-V semiconductor or a II-VI semiconductor. In one embodiment, the semiconductor substrate 10 comprises a bulk substrate, while in another embodiment, the semiconductor substrate 10 comprises a semiconductor-on-insulator substrate.

In one or more embodiments, the structures 20 are formed over and within the semiconductor substrate 10 using conventional semiconductor processing. The structures 20 may include doped regions disposed within the semiconductor substrate 10 as well as metallization and contact structures disposed over the semiconductor substrate 10.

In one or more embodiments, the structures 20 may include active devices such as transistors, diodes, or other passive devices such as resistors, inductors, capacitors.

After completing front end processing steps such as forming doped regions, any metallization layers needed to interconnect active devices and/or couple to external circuitry is formed. Metallization layers may include a plurality of metal lines and vias.

In one embodiment, the structures 20 comprise Hall effect sensor devices. The structures 20 may also include additional circuitry for operating the Hall effect sensor devices.

After completing the metallization, the semiconductor substrate 10 has a first thickness d1 of about 100 μm to about 400 μm. The first thickness d1 may depend on the wafer diameter.

The semiconductor substrate 10 is next thinned down to a second thickness d2 as illustrated in FIG. 3b. The second thickness d2 may be about 10 μm or less in one embodiment. In various embodiments, the second thickness d2 may be about 10 μm to about 50 μm. In various embodiments, the semiconductor substrate 10 is thinned from the back side using mechanical means such as grinding, or chemical means such as etching, or combinations of chemical and mechanical means.

Figure 3C:
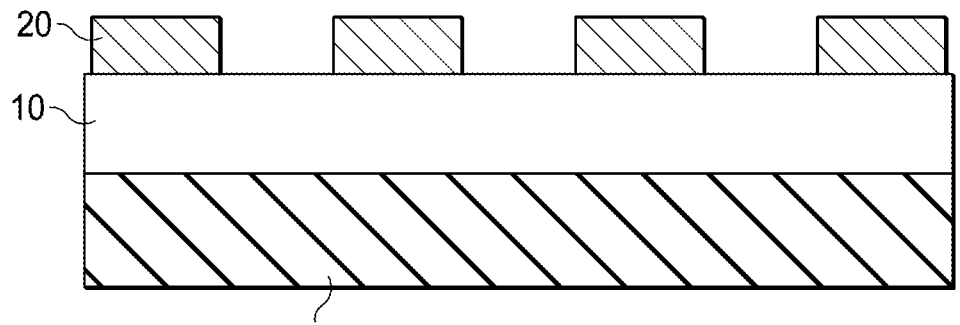

The back side of the semiconductor substrate 10 is next placed over an insulating substrate 30 (FIG. 3c). The insulating substrate 30 has a thickness of about 200 µm to about 600 µm in various embodiments. The insulating substrate 30 comprises a glass substrate in one embodiment having a coefficient of thermal expansion similar to that of the semiconductor substrate 10. In one embodiment, the coefficient of thermal expansion of the insulating substrate 30 is about the same as the coefficient of thermal expansion of the semiconductor substrate 10 between room temperature to about 500° C. In various embodiments, the coefficient of thermal expansion of the insulating substrate 30 (CTE(30)) is within 10% of the coefficient of thermal expansion of the semiconductor substrate 10 (CTE(10)) i.e., 1.1CTE(10)>CTE(30)>0.9CTE(10). This ensures that the semiconductor substrate 10 does not separate from the insulating substrate 30 during subsequent higher temperature processing.

In one embodiment, after cleaning the back surface of the semiconductor substrate 10 and the top surface of the insulating substrate 30, the semiconductor substrate 10 is placed over the insulating substrate 30 directly and clamped together to build an anodic bond. Metal electrodes are attached to a bottom surface of the insulating substrate 30 and the top surface of the semiconductor substrate 10. The insulating substrate 30 is heated to about 300° C. to about 400° C. and high potential is applied, e.g., at least 500V up to 2 kV between the electrode generating a large electric field. The sodium ions within the glass are displaced from the top surface of the insulating substrate 30 by the applied electrical field. The depleted top surface of the insulating substrate 30 reacts with the back surface of the semiconductor substrate 10 forming a solid covalent bond.

In another embodiment, an adhesive comprising an epoxy compound may be applied before placing the semiconductor substrate 10 over the insulating substrate 30. After applying the adhesive, the epoxy compound may be heated to form an adhesive bond (adhesive layer, which is not illustrated) between the semiconductor substrate 10 and the insulating substrate 30.

Figure 3D:
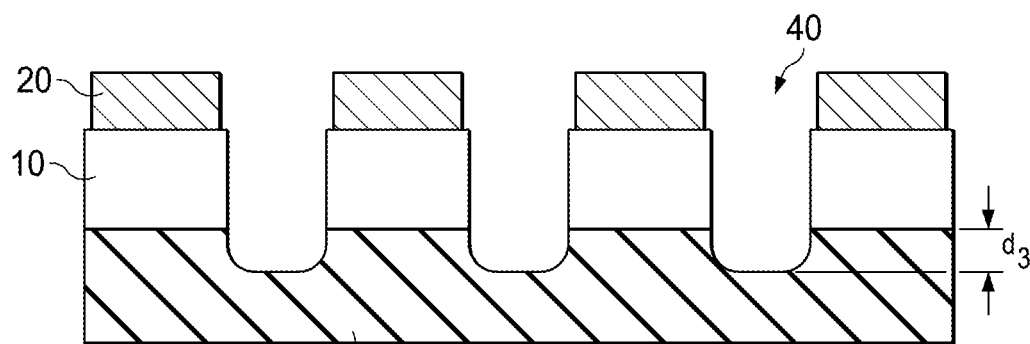

Next, the semiconductor device is partially diced as illustrated in FIG. 3d. Individual chips are diced using, for example, a mechanical sawing process. The sawing process cuts through the semiconductor substrate 10 forming trench openings 40. The trench openings 40 extend through the semiconductor substrate 10 completely and partially through the insulating substrate 30. In various embodiments, the trench openings 40 extend into the insulating substrate 30 to a third thickness d3 of about 10 µm to about 50 µm. The partial dicing process advantageously enables the subsequent covering of the sidewalls of the semiconductor substrate 10, and still retaining the wafer-shape.

Figure 3E:
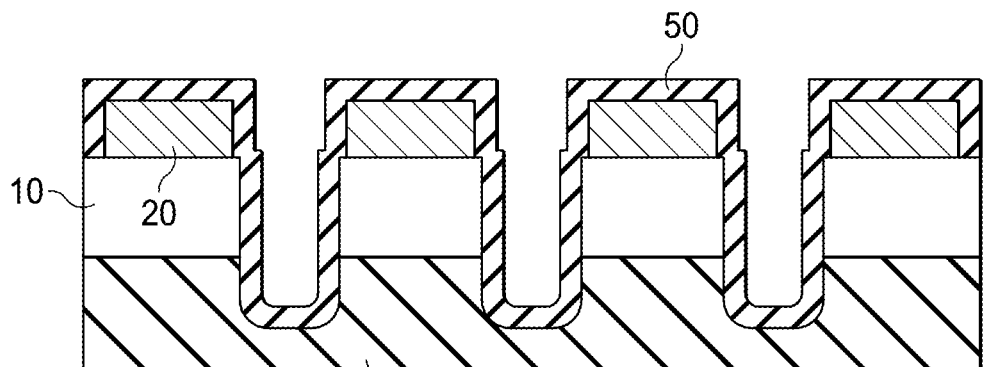

Referring next to FIG. 3e, an isolation layer 50 is formed over the exposed surfaces. The isolation layer 50 may be deposited or coated in various embodiments. In various embodiments, the isolation layer 50 is deposited over the sidewalls along the trench openings 40 and the top surfaces. The isolation layer 50 comprises an oxide, a nitride, or other dielectric layers. The isolation layer 50 may comprise a single layer or a plurality of layers in various embodiments. The isolation layer 50 may be deposited using a vapor deposition process such as chemical vapor deposition, plasma vapor deposition, or other deposition processes. The isolation layer 50 may be coated using spin-on processes in some embodiments.

Figure 3F:
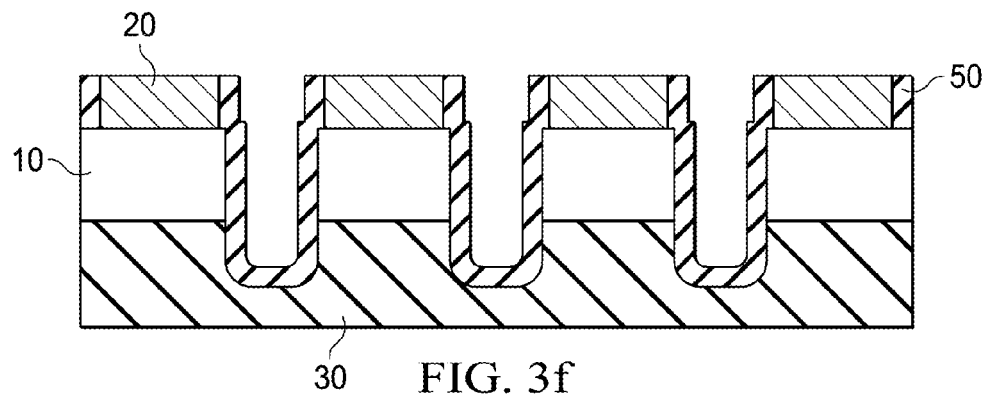

As next illustrated in FIG. 3f, the isolation layer 50 is removed from the top surface of the chips so that contacts can be made to the chips. In one embodiment, the isolation layer 50 is removed using a chemical mechanical planarization process. In alternative embodiments, other suitable processes may be used.

Figure 3G:
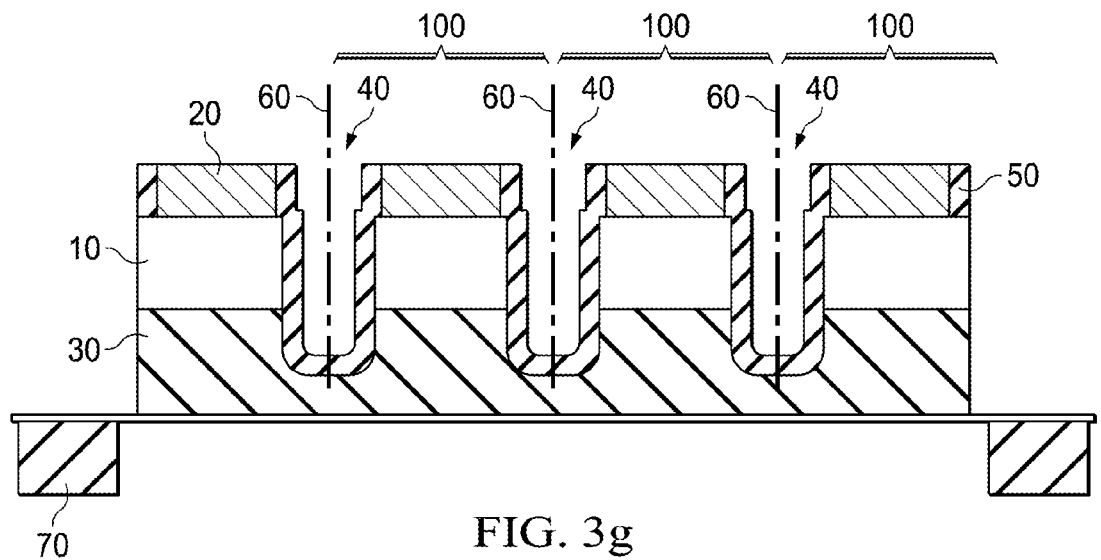
Figure 3H:
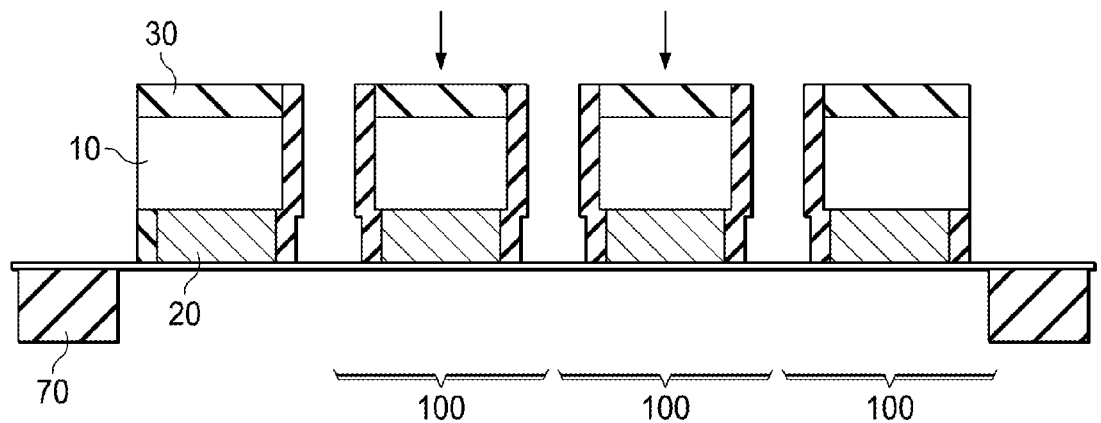

Referring next to FIG. 3g, the semiconductor device is placed over a carrier 70, e.g., in one embodiment a dicing frame with a suitable tape, and trench openings 40 are diced along dicing streets 60 forming separate chips 100 (or dies). In an alternative embodiment illustrated in FIG. 3h, the top surface of the semiconductor device is placed on the carrier 70. The insulating substrate 30 is next thinned from the back surface. The chips 100 separate after the thickness of the insulating substrate 30 reduces below the third thickness d3.

Figure 4A:
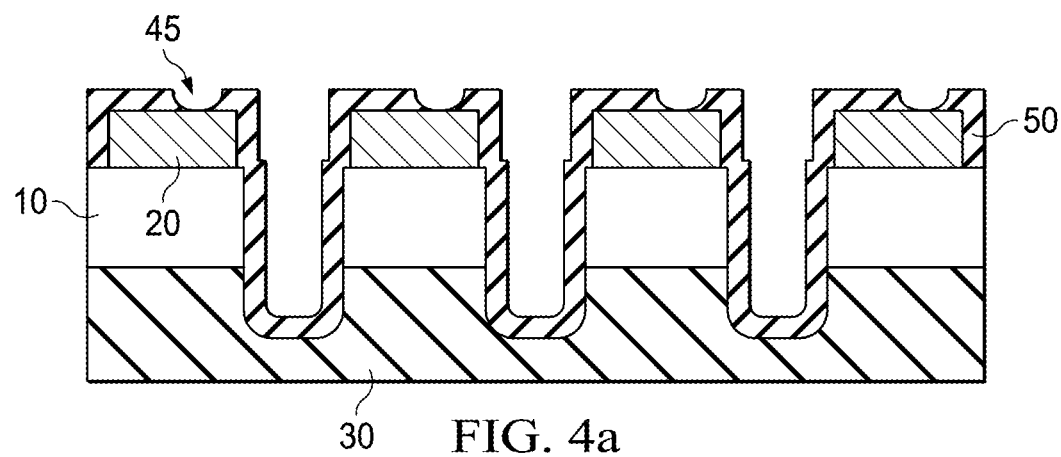
FIGS. 4a-4b, illustrates an alternative embodiment of fabricating the semiconductor device.
Figure 4B:
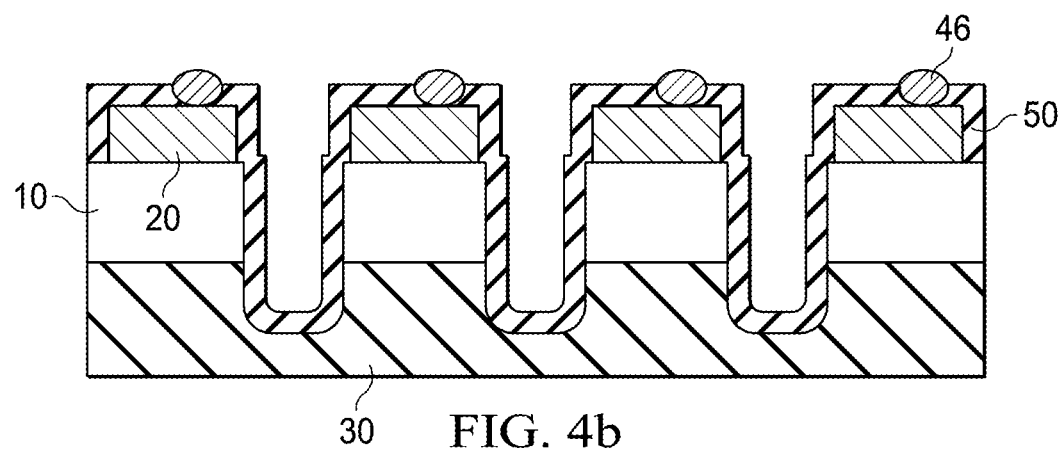

FIG. 4, which includes FIGS. 4a-4b, illustrates an alternative embodiment of fabricating the semiconductor device.

This embodiment follows the prior embodiment forming the isolation layer 50 as illustrated in FIGS. 3a-3e. However, unlike FIG. 3f, wherein the isolation layer 50 is removed from the top surface of the semiconductor device, in this embodiment, contacts are formed locally within the isolation layer 50. As illustrated in FIG. 3f, the isolation layer 50 is patterned forming openings 45. The patterning of the isolation layer 50 may be performed using standard lithography processes.

As next illustrated in FIG. 4b, the openings 45 are filled with a fill metal such as a solder metal forming contacts 46. Alternatively, in some embodiments, contacts pads are formed without completely filling the openings 45. The openings 45 are subsequently filled, for example, during solder ball formation. Subsequent processing proceeds as in prior embodiment described with respect to FIGS. 3g and 3h.

FIG. 5, which includes FIGS. 5a-5i, illustrates a semiconductor device during various stages of processing in alternative embodiments of the invention.

Figure 5A:
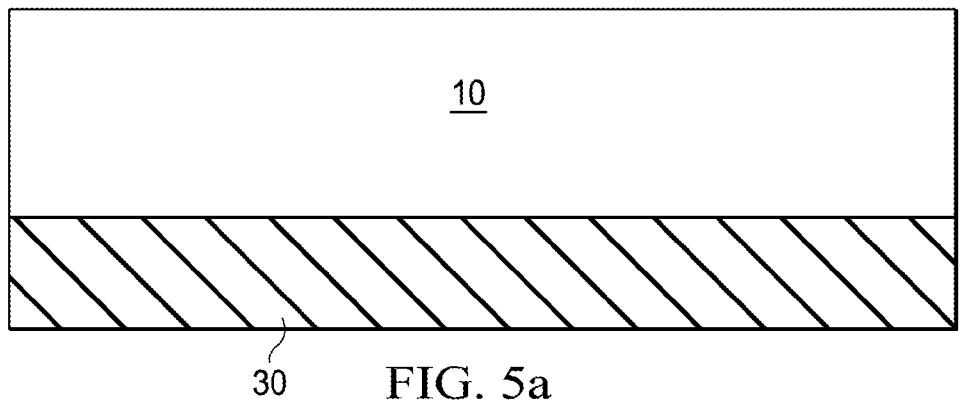
FIGS. 5a-5i, illustrates a semiconductor device during various stages of processing in alternative embodiments of the invention.

Referring to FIG. 5a, an insulating substrate 30 is attached to a semiconductor substrate 10. In various embodiments, the insulating substrate 30 is bonded with the semiconductor substrate 10 using anodic bonding. Anodic bonding is stable to a higher temperature because of the direct chemical bonding between the insulating substrate 30 and the semiconductor substrate 10. Therefore, conventional semiconductor processing steps can be performed while the insulating substrate 30 is attached with the semiconductor substrate 10.

Figure 5B:
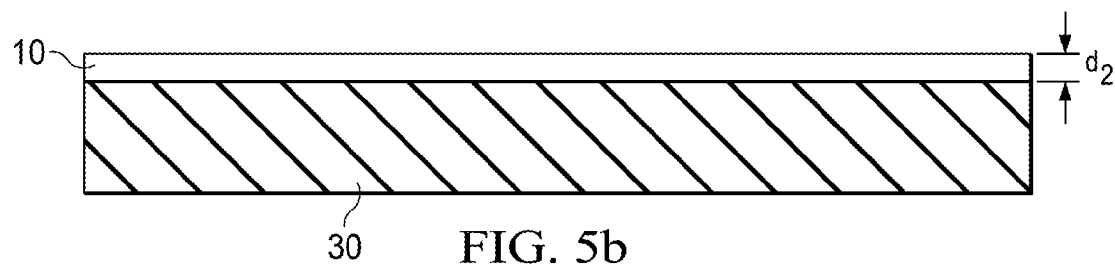
Figure 5C:
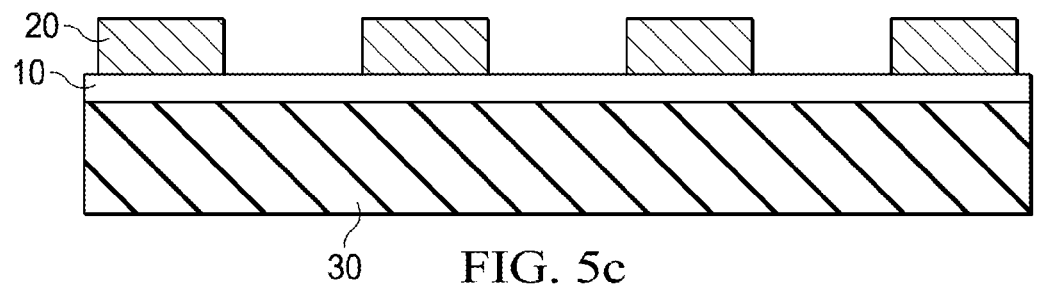

As next illustrated in FIG. 5b, the top surface of the semiconductor substrate 10 is thinned to a second thickness d2 using mechanical and/or chemical processes. Referring next to FIG. 5c, structures 20 are formed within and over the semiconductor substrate 10.

Figure 5D:
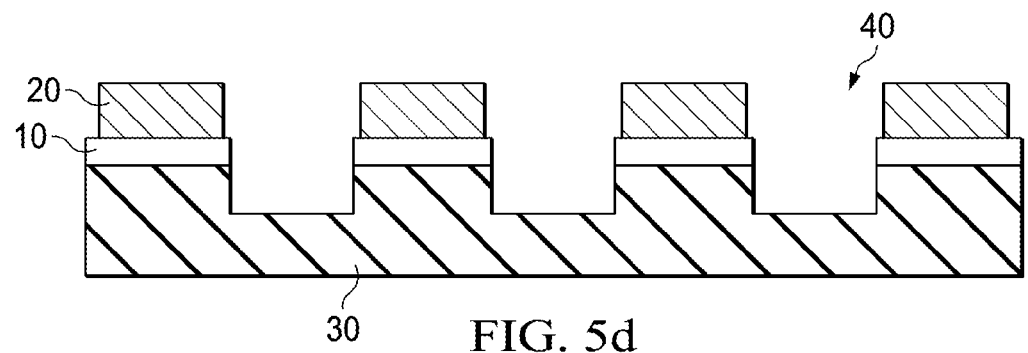

Trench openings 40 are formed adjacent the structures 20 separating individual chips (FIG. 5d). However, the trench openings 40 do not form independent chips although the trench openings 40 extend through the semiconductor substrate 10. In one or more embodiments, the trench openings 40 extend partially into the insulating substrate 30 to a third distance d3.

Figure 5E:
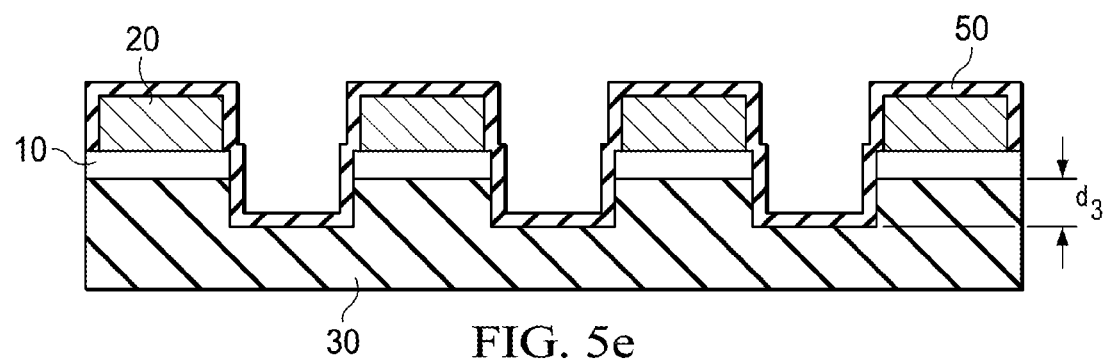

As next illustrated in FIG. 5e, an isolation layer 50 is deposited over the structures 20 and the sidewalls of the trench openings 40. The isolation layer 50 comprises an oxide, a nitride, or a combination in various embodiments.

Figure 5F:
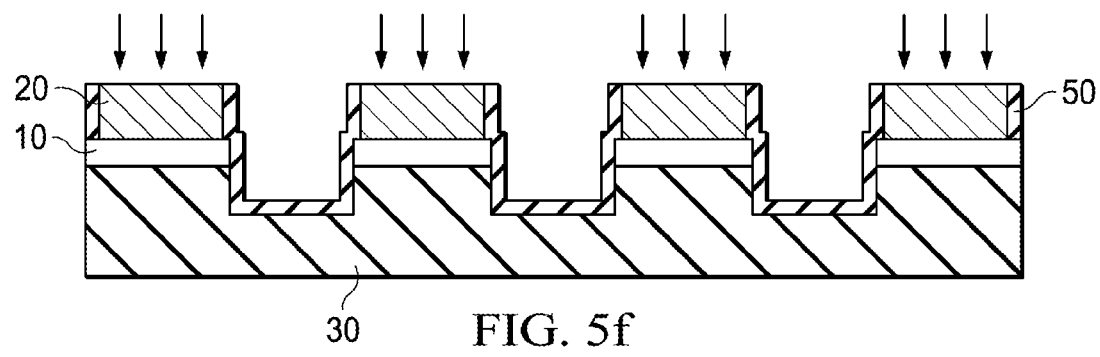
Figure 5G:
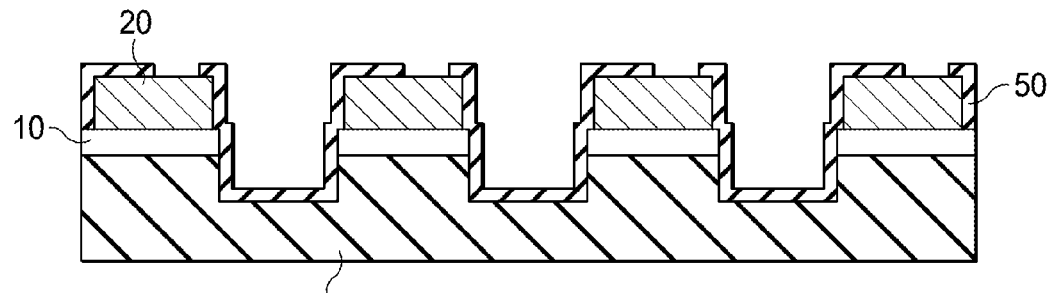

Subsequent processing may follow either the embodiment illustrated in FIG. 5f or FIG. 5g. In FIG. 5f, the isolation layer 50 is removed from the top surface of the structures 20 whereas in FIG. 5g, the isolation layer 50 is partially removed facilitating formation of small contact regions.

Figure 5H:
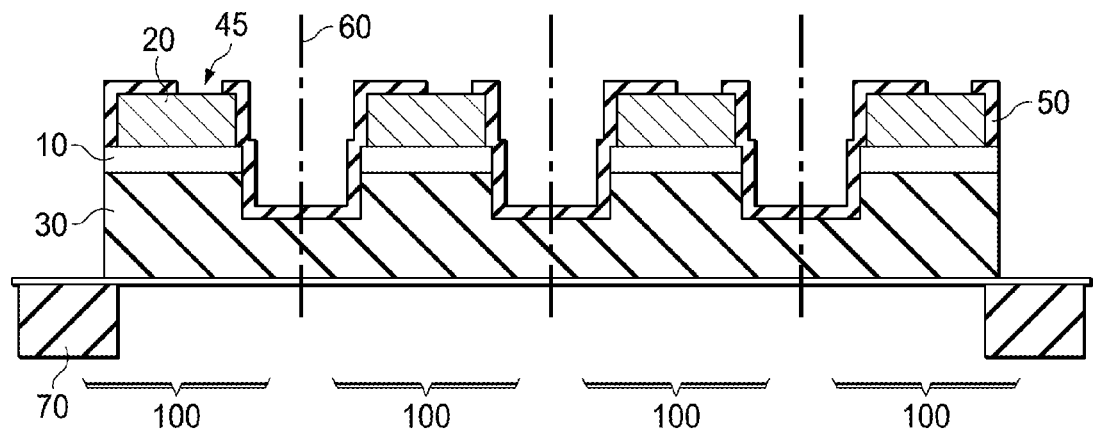
Figure 5I:
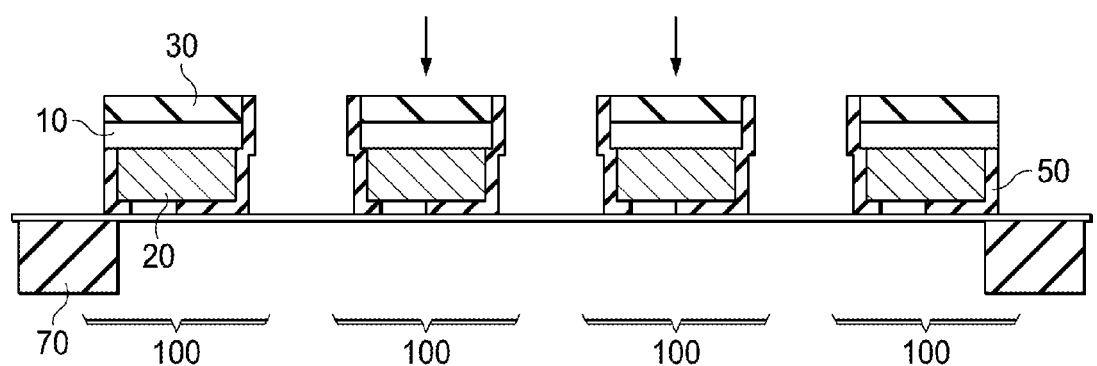

After forming contacts 46, further processing may follow either the embodiment illustrated in FIG. 5h or FIG. 5i. In FIG. 5h, the chips 100 are separated from the front side by sawing along dicing streets 60 after placing the semiconductor device on a carrier 70.

In the embodiment of FIG. 5i, the semiconductor device is placed over a carrier 70. The semiconductor substrate 10 is inverted such that the back side of the semiconductor substrate 10 is facing upwards while a front side is facing towards a carrier 70. The insulating substrate 30 is thinned, for example, using a grinding process, to singulate the workpiece into separate chips 100. The residual insulating substrate 30 having the third thickness d3 is thicker than the isolation layer 50 and isolates the semiconductor substrate 10 (and therefore the structures 20) much more effectively than the isolation layer 50 (or other deposited insulation layers) from the high current source during sensing operations. The residual insulating substrate 30 comprises a third thickness d3 of about 20 µm to about 70 µm. In one embodiment, the third thickness d3 of the residual insulating substrate 30 is 50 µm or less.

FIG. 6, which includes FIGS. 6a-6h, illustrates an alternative embodiment of the various stages of fabricating the semiconductor device.

Figure 6A:
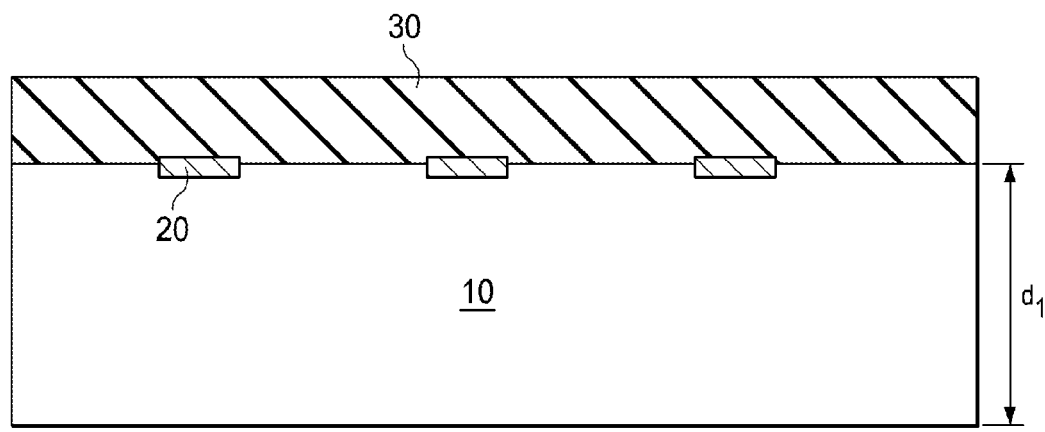
FIGS. 6a-6h, illustrates an alternative embodiment of the various stages of fabricating the semiconductor device.
Figure 6B:
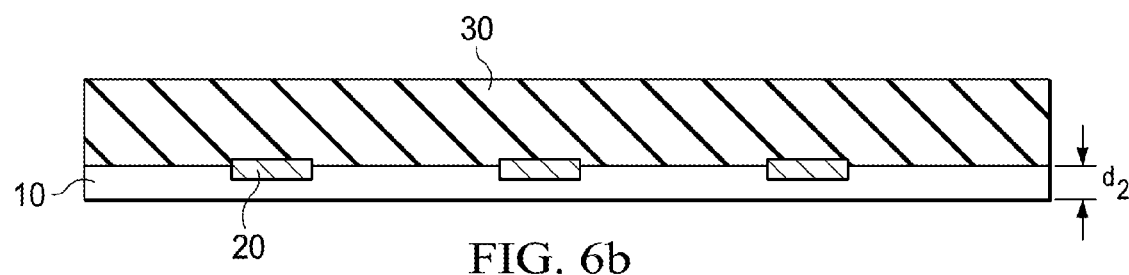
Figure 6C:
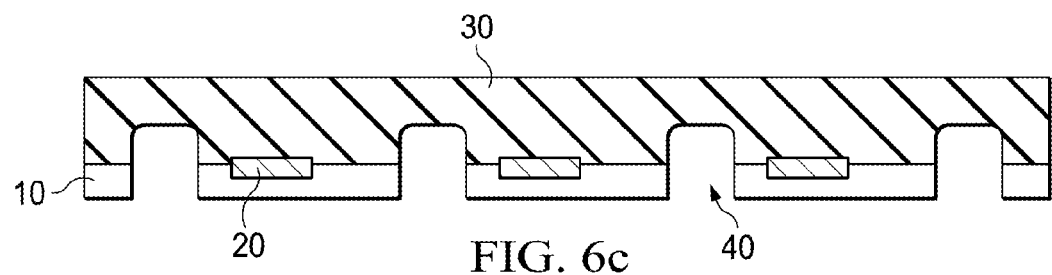

Referring to FIG. 6a, the structures 20 are formed within a semiconductor substrate 10. As in prior embodiments, the structures 20 may comprise doped regions, including device regions, as well as metallization levels.

An insulating substrate 30 is placed over the semiconductor substrate 10 after forming the structures 20. Unlike prior embodiments, the insulating substrate 30 is placed adjacent the top side of the semiconductor substrate 10 having the structures 20. The front side of the insulating substrate 30 is bonded with the back side of the semiconductor substrate 10 using anodic bonding or adhesive bonding.

The semiconductor substrate 10 is next thinned from the back side from a first thickness d1 to a second thickness d2. As next illustrated in FIG. 6c, trench openings 40 are formed within the semiconductor substrate 10 and partially into the insulating substrate 30. The trench openings 40 extend up to a third distance d3 into the insulating substrate 30. In various embodiments, the trench openings 40 may be formed by mechanical processes, chemical processes, or a combination thereof. In one embodiment, the trench openings 40 are formed by lithographic masking and etching process. Because of the previous thinning step, the trench openings 40 are made more efficiently.

Figure 6D:
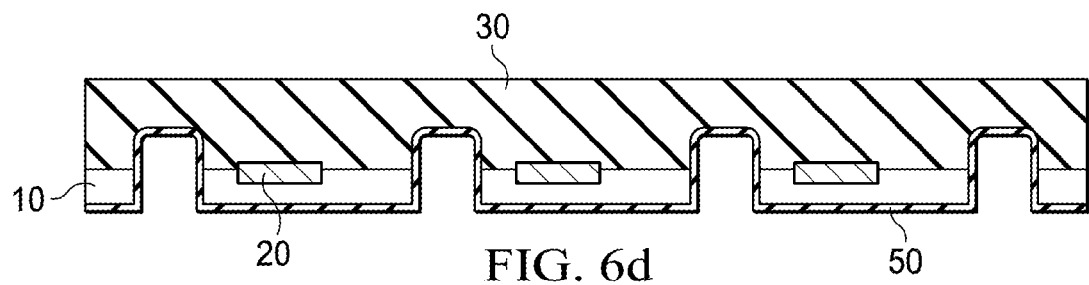
Figure 6E:
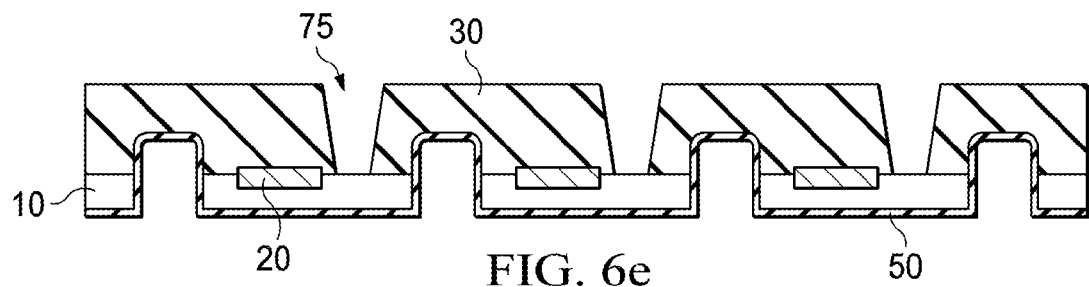

Next as illustrated in FIG. 6d, an isolation layer 50 is formed over the exposed sidewalls and back surface of the semiconductor substrate 10. The isolation layer 50 forms a conformal layer over the semiconductor substrate 10, and the exposed insulating substrate 30.

Contact openings 75 are next formed from the back side of the insulating substrate 30. The back side of the insulating substrate 30 is opposite to the front side, which is bonded with the semiconductor substrate 10. Contact openings 75 are formed through the insulating substrate 30. In one embodiment, the contact openings 75 are formed through lithography processes wherein a photo resist is deposited, exposed, developed, and used as an etching mask.

In an alternative embodiment, the insulating substrate 30 includes preprocessed cavities. In such embodiments, the preprocessed cavities are directly aligned with the contact areas on the semiconductor substrate 10 when aligning the insulating substrate 30 with the semiconductor substrate 10. In one embodiment, the preprocessed cavities may be filled with a dummy fill material, which may be removed at this stage of processing to form the contact openings 75.

Figure 6F:
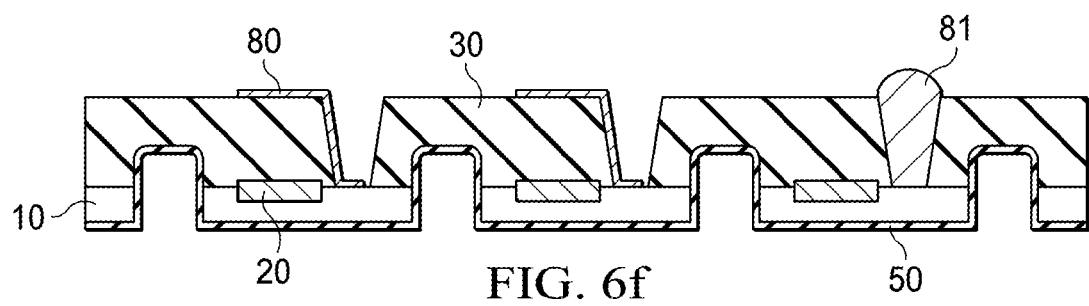

As next illustrated in FIG. 6f, contact pads 80 are formed over the insulating substrate 30. The contact pads 80 couple to the contact areas on the semiconductor substrate 10 including metallization layers over the semiconductor substrate 10. The contact pads 80 may comprise aluminum, copper, silver, gold, platinum, titanium, tungsten, any other suitable metal, and/or combinations thereof. The cavities may also be completely filled with, e.g., any kind of low-melting solder paste, to create a bump-like via-contact. Various alternative contacts are possible in different embodiments, e.g., bump 81 is illustrated in one embodiment. Thinning of insulating substrate 30 is not required when alternative contacts such as bump 81 is formed.

Figure 6G:
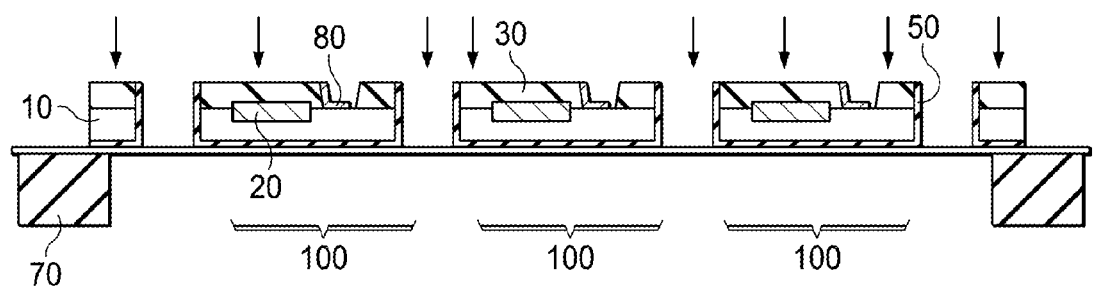

Next, as illustrated in FIG. 6g, after placing the workpiece comprising the semiconductor substrate 10 and the insulating substrate 30 over a carrier 70, the insulating substrate 30 is thinned to separate individual chips 100. In an alternative embodiment illustrated in FIG. 6h, a dicing process is used to saw through the insulating substrate 30 and the semiconductor substrate 10.

Figure 6H:
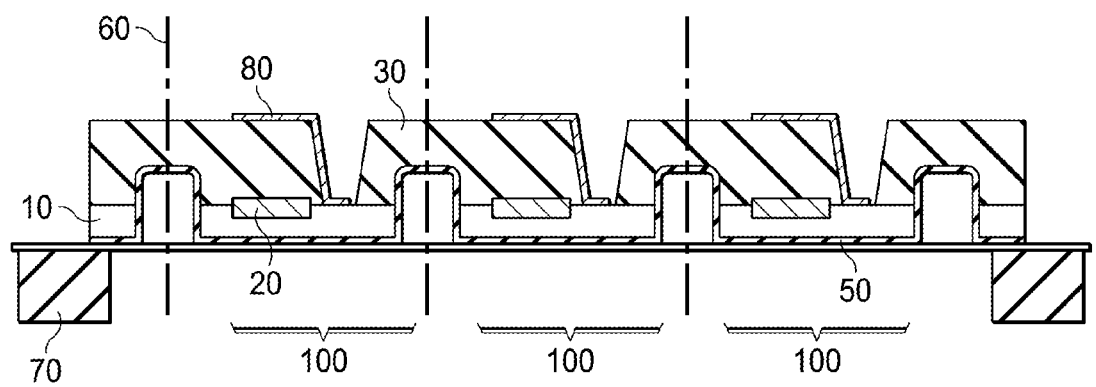

Advantageously, in this embodiment, an insulator is formed around all sides of the chip 100 as illustrated in FIGS. 6g and 6h.

FIG. 7, which includes FIGS. 7a-7e, illustrates another embodiment of fabricating the semiconductor device.

Unlike the prior embodiment illustrated in FIG. 6, in this embodiment, a insulating substrate covers the back side of the semiconductor substrate 10. The use of the insulating substrate provides enhanced protection from high voltage breakdown and therefore improved isolation compared to isolation layers, which are generally thinner and offer less protection to dielectric breakdown.

Figure 7A:
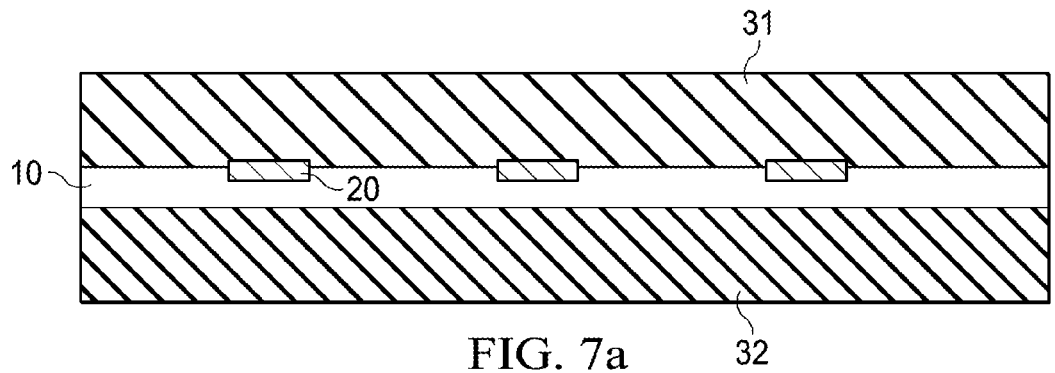
FIGS. 7a-7e, illustrates another embodiment of fabricating the semiconductor device.

Referring to FIG. 7a, in this embodiment, a first insulating substrate 31 is formed over the top side of the semiconductor substrate 10 as described in FIG. 6a. However, a second insulating substrate 32 is placed under the back side of the semiconductor substrate 10. The first and the second insulating substrates 31 and 32 may be sequentially placed and bonded using, for example, anodic bonding. Alternatively, the first and the second insulating substrates 31 and 32 may be bonded at the same time, using, for example, an adhesive bonding process.

Figure 7B:
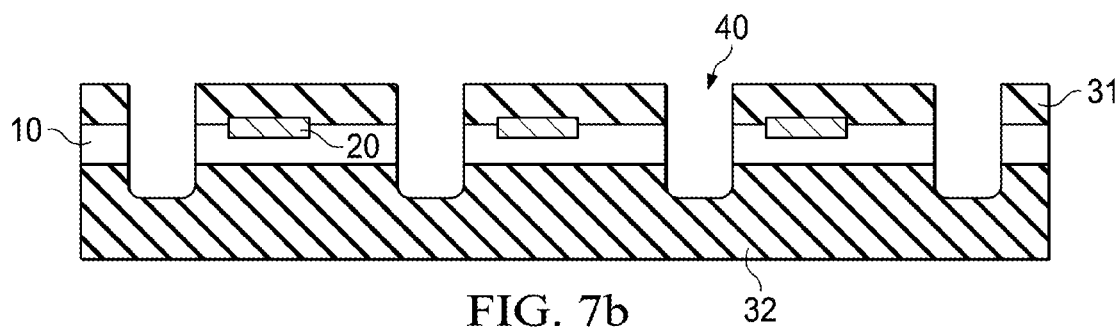

Next, as illustrated in FIG. 7b, trench openings 40 are formed around the chip regions. The trench openings 40 may be formed as in prior embodiments, using mechanical and/or chemical processes. The trench openings 40 extend completely through the first insulating substrate 31 and the semiconductor substrate 10, and extend partially into the second insulating substrate 32.

Figure 7C:
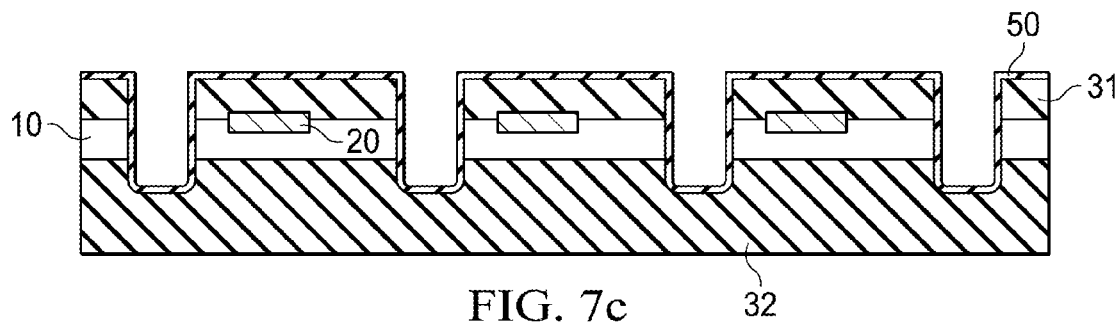

As next illustrated in FIG. 7c, a isolation layer 50 is formed over the first insulating substrate 31 and exposed sidewalls of the semiconductor substrate 10, and the first insulating substrate 31. In various embodiments, the isolation layer 50 may be formed over either or both the first insulating substrate 31 and the second insulating substrate 32.

Figure 7D:
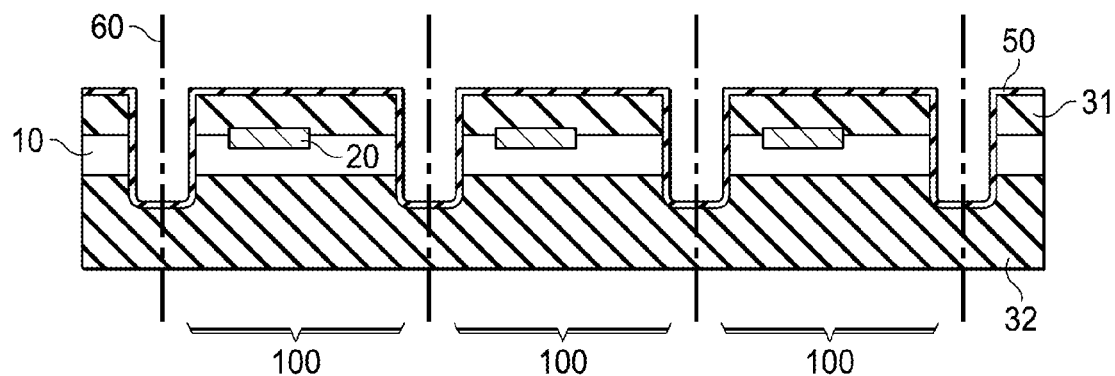
Figure 7E:
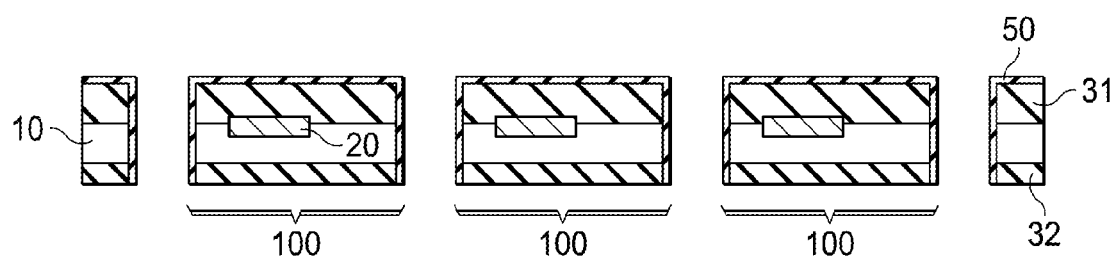

Individual chips may be separated as in prior embodiments. For example, as illustrated in FIG. 7d, the chips 100 may be formed by dicing along dicing streets 60, or as illustrated in FIG. 7e, the chips 100 may be formed by grinding the back side of the second insulating substrate 32.

Figure 8A:
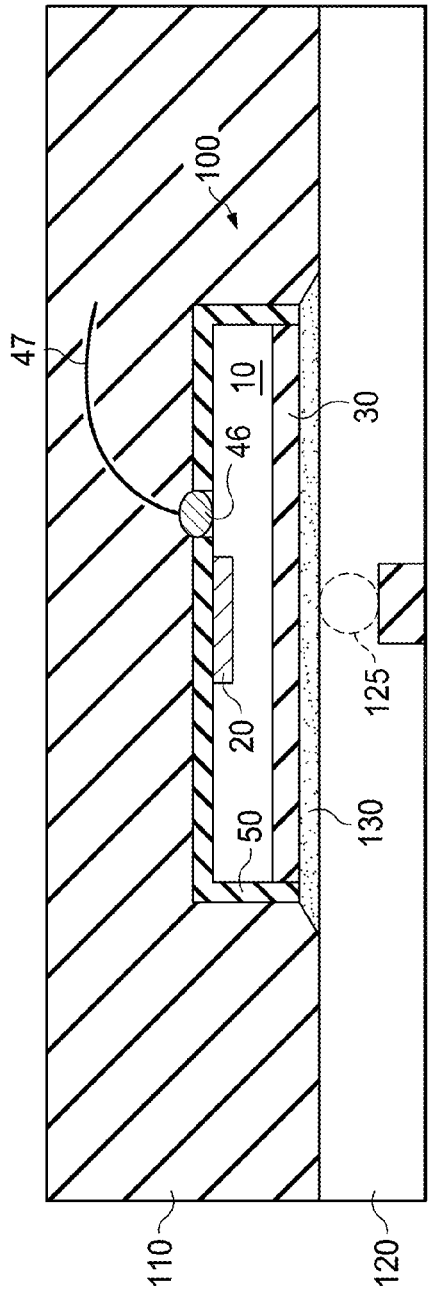
Figure 8B:
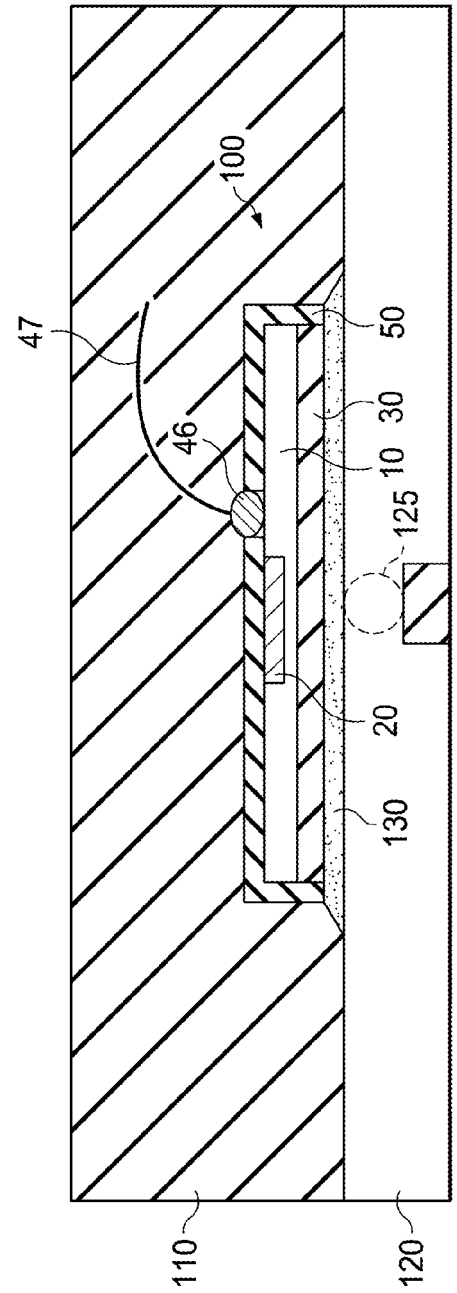

FIG. 8, which includes FIGS. 8a-8d, illustrates a chip package in accordance with various embodiments of the invention.

In various embodiments, the chip 100 may be packaged using any of the available packaging technologies. FIGS. 8a-8d illustrative packaging as a means to illustrate the invention.

Referring to FIG. 8a, a chip 100 comprises a semiconductor substrate 10 having the structures 20, for example, as described with respect to FIG. 1. The sidewalls of the chip 100 are surrounded by an isolation layer 50. A contact 46 is formed within the isolation layer 50, for example, as described with respect to FIG. 2b. An insulating substrate 30 is disposed underneath the semiconductor substrate 10. Thus, the chip 100 includes the insulating substrate 30, the semiconductor substrate 10, the structures 20, and the isolation layer 50.

The chip 100 is mounted over a leadframe 120. The chip 100 may be attached to the leadframe 120 using an adhesive layer 130, which may also be an epoxy layer. The contacts 46 may be coupled to leads (not shown) on the leadframe 120, for example, through wirings 47. The leadframe 120 includes a primary conductor 125 that is designed to flow a current to be measured. The wirings 47 are coupled to pins that are electrically separate and isolated from the primary conductor of the leadframe. A protective mold compound no encapsulates the chip 100, the wirings 47, and the leadframe 120.

The semiconductor package thus includes a semiconductor chip 100 electrically coupled to the leadframe 120, and a mold compound no encapsulating the leadframe 120 and the chip 100.

During operation, the current to be measured flow is passed through a primary conductor 125. In FIG. 8, the current flow direction is either into or out of the plane of paper. In various embodiments, the primary conductor 125 may be formed to have a lower resistance relative to the leadframe or other features, such as structural features, may be introduced to concentrate the flowing current under the structures 20.

In the embodiment of FIG. 8a, the insulating substrate 30 comprises a thickness $d_i$ of about 10 μm to about 100 μm, and the semiconductor substrate 10 comprises a thickness $d_s$ of about 100 μm to about 400 μm. In this embodiment, the insulating substrate 30 comprises a thickness that has been obtained by thinning the insulating substrate 30, for example, as described in the embodiment of FIG. 3h. In this embodiment, the insulating substrate 30 provide the necessary isolation voltage between the structures 20 and the primary conductor 125.

FIG. 8b illustrates an alternative embodiment in which the semiconductor substrate 10 comprises a thickness that has been obtained by thinning the semiconductor substrate 10, for example, as described in the embodiment of FIG. 5i. In this embodiment, the semiconductor substrate 10 comprises a thickness $d_s$ of about 10 μm to about 50 um, and about 20 μm or less in one embodiment.

FIG. 8c illustrates an alternative embodiment of a chip 100 described in FIG. 6 having an insulating substrate 30 disposed over the semiconductor substrate 10. The contact 46 is made through the contact pads 80 and coupled to leads on the leadframe through wirings 47.

FIG. 8d illustrates an alternative embodiment of a chip 100 described in FIG. 7 having a first insulating substrate 31 and a second insulating substrate 32. The isolation layer 50 is formed on the sidewalls of the chip 100, and may be formed over either or both the first insulating substrate 31 and the second insulating substrate 32.

Figure 9:
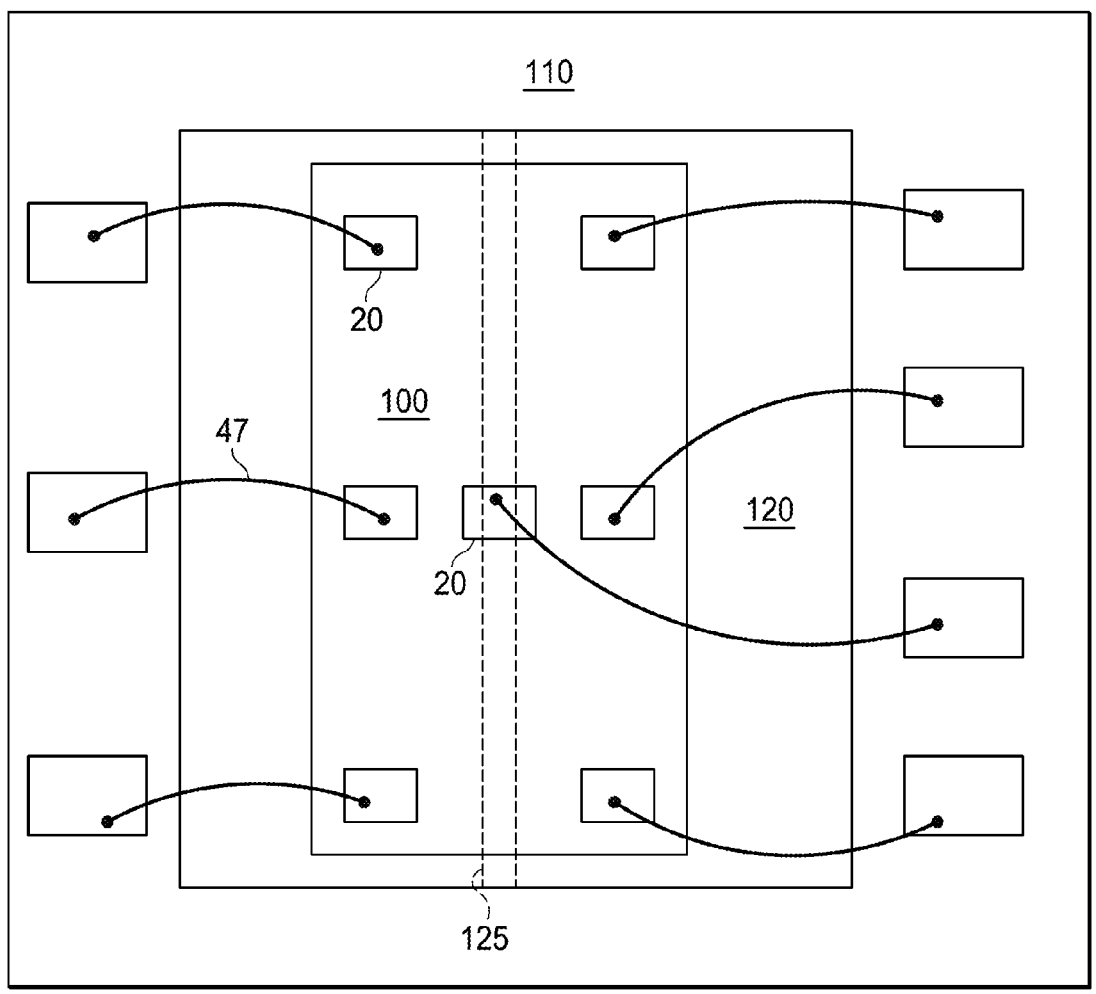
FIG. 9 illustrates a top view of a semiconductor device in accordance with various embodiments of the invention.

FIG. 9 illustrates a top view of a semiconductor device in accordance with various embodiments of the invention. FIG. 9 illustrates a top view of the semiconductor package illustrated in FIGS. 8a-8d.

The mold compound 110 surrounds the leadframe 120 and the chip 100, which is disposed over the leadframe 120. The structures 20, which may comprise a plurality of magnetic sensors as described in prior embodiments, may be disposed around and over a primary conductor 125 in the leadframe 120. The plurality of magnetic sensors may be placed directly above and to the left and right of the primary conductor 125. In one embodiment, the structures 20 are arranged alternately on the left and right sides relative to the primary conductor 125. In various embodiments, other shapes and configurations of the magnetic sensors may be used. As described with respect to FIG. 8, the structures 20 are coupled to leads 140 through wirings 47.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a current sensor device, the method comprising:
   forming a device region comprising a magnetic sensor within and/or over a semiconductor substrate, the device region being formed adjacent a front side of the semiconductor substrate comprising a back side and a front side, the back side being opposite the front side;
   attaching the front side of the semiconductor substrate over an insulating substrate;
   thinning the semiconductor substrate from the back side to expose a back surface;
   exposing sidewalls of the semiconductor substrate by dicing the semiconductor substrate from the back side without completely dicing the insulating substrate;
   forming an isolation liner over all of the exposed sidewalls of the semiconductor substrate and the back surface of the semiconductor substrate, wherein the isolation liner and the insulating substrate comprise a different material;
   forming a contact opening in the insulating substrate;
   forming a contact to the device region within the contact opening; and
   separating the insulating substrate to form diced chips.

2. The method of claim 1, wherein separating the insulating substrate comprises mechanical dicing.

3. The method of claim 1, wherein separating the insulating substrate comprises grinding the insulating substrate.

4. The method of claim 1, wherein the device region comprises a Hall Element of a Hall effect sensor, and wherein the insulating substrate is a glass substrate.

5. The method of claim 1, wherein forming an isolation liner comprises depositing the isolation liner using a vapor deposition process.

6. A method of forming a current sensor device, the method comprising:
    forming a device region comprising a magnetic sensor within and/or over a semiconductor substrate, the device region being formed adjacent a front side of the semiconductor substrate comprising a back side and a front side, the back side being opposite the front side;
    attaching the front side of the semiconductor substrate over a glass substrate;
    thinning the semiconductor substrate from the back side to expose a back surface;
    from the back side, forming trenches in the glass substrate to expose sidewalls of the semiconductor substrate;
    depositing an isolation liner over all of the exposed sidewalls of the semiconductor substrate and the back surface of the semiconductor substrate, wherein the isolation liner and the glass substrate comprise a different material;
    forming an opening for a contact in the glass substrate, the opening exposing a device contact region on the device region;
    forming the contact to the device region within the opening; and
    separating the insulating substrate to form diced chips.

7. The method of claim 6, wherein the glass substrate is thicker than the semiconductor substrate after the thinning.

8. The method of claim 6, wherein the opening for the contact comprises slanted sidewalls.

9. The method of claim 6, wherein the separating the insulating substrate comprises grinding the glass substrate up to the trenches.

10. The method of claim 6, wherein the separating the insulating substrate comprises mechanically dicing through the glass substrate above the trenches.

11. The method of claim 6, wherein the device region comprises a Hall Element of a Hall effect sensor.

12. The method of claim 6, wherein forming an isolation liner comprises depositing the isolation liner using a vapor deposition process.

13. A method of forming a current sensor device, the method comprising:
    providing a magnetic sensor within and/or over a semiconductor substrate, the magnetic sensor being formed adjacent a front side of the semiconductor substrate comprising a back side and a front side, the back side being opposite the front side;
    attaching the front side of the semiconductor substrate to a glass substrate;
    thinning the semiconductor substrate from the back side to expose a back surface, wherein the glass substrate is thicker than the semiconductor substrate after the thinning;
    from the back side, forming trenches in the glass substrate to expose sidewalls of the semiconductor substrate;
    depositing an isolation liner over all of the exposed sidewalls of the semiconductor substrate and the back surface of the semiconductor substrate, wherein the isolation liner and the glass substrate comprise a different material;
    etching an opening for a contact in the glass substrate, the opening exposing a device contact region on the device region;
    forming the contact to the device region within the opening; and
    separating the insulating substrate to form diced chips.

14. The method of claim 13, wherein the opening for the contact comprises slanted sidewalls.

15. The method of claim 13, wherein the separating the insulating substrate comprises grinding the glass substrate up to the trenches.

16. The method of claim 13, wherein the separating the insulating substrate comprises mechanically dicing through the glass substrate above the trenches.

17. The method of claim 13, wherein the device region comprises a Hall Element of a Hall effect sensor.

18. The method of claim 13, wherein forming an isolation liner comprises depositing the isolation liner using a vapor deposition process.

* * * * *